United States Patent [19]

Fukui et al.

[11] Patent Number: 4,922,199
[45] Date of Patent: May 1, 1990

[54] ROTARY POSITION TRANSDUCER HAVING HINGED CIRCUIT BOARDS

[75] Inventors: Ronald D. Fukui, Portage, Mich.; Wataru Ichikawa, Fuchu; Kazuya Sakamoto, Akishima, all of Japan

[73] Assignee: Enprotech Corp., New York, N.Y.

[21] Appl. No.: 199,384

[22] Filed: May 27, 1988

[51] Int. Cl.$^5$ .......................... G01B 7/29; G01P 3/44; H05K 11/14; H05K 7/16
[52] U.S. Cl. ................................ 324/207.17; 29/831; 324/163; 324/207.25; 340/870.32; 361/398; 361/412
[58] Field of Search ............... 324/207, 208, 160, 163, 324/166, 173, 174; 340/870.31, 870.32; 341/15; 361/398, 393–395, 412–415; 174/68.5; 29/829–831; 318/653, 660, 661

[56] References Cited

U.S. PATENT DOCUMENTS

| | | | |
|---|---|---|---|
| 3,113,248 | 12/1963 | Friedman | 361/398 |
| 3,873,889 | 3/1975 | Layba | 361/398 X |
| 3,971,127 | 7/1976 | Giguere et al. | 174/68.5 X |
| 4,104,701 | 8/1978 | Baranowski | 361/398 X |
| 4,107,604 | 8/1978 | Bernier | 341/15 X |
| 4,510,551 | 4/1985 | Brainard, II | 361/398 |
| 4,604,575 | 8/1988 | Shimizu et al. | 324/208 |
| 4,728,834 | 3/1988 | Kumar et al. | |
| 4,742,183 | 5/1988 | Soloway et al. | 361/412 X |
| 4,810,917 | 3/1989 | Kumar et al. | |

FOREIGN PATENT DOCUMENTS 0065425 11/1982 European Pat. Off. ............ 361/398
55-111656 8/1980 Japan .

OTHER PUBLICATIONS

Kerjilian et al., High Density Memory Package, IBM Technical Disclosure Bulletin vol. 27 No. 4B Sep. 1984, p. 2642.

Primary Examiner—Gerard R. Strecker
Attorney, Agent, or Firm—McAulay Fisher Nissen & Goldberg

[57] ABSTRACT

A position transducer has an input shaft coupled to a variable inductance sensor to produce an output electrical signal representing shift angle position. The transducer includes a plurality of rigid circuit boards which are hinged to one another so that the circuit boards and the electronic circuitry supported on the boards can be wrapped around the variable inductance sensor. The individual rigid circuit board segments are laminated onto a flexible sheet having conductive tracks. The track sheet provides the hinged effect.

The power supply which is mounted on one or more of the boards provides DC power through an AC circuit fed by a transistor which is switched on and off as a function of the power needs of the transducer. By thus having an ON duty cycle substantially less than 100 percent, the heat generated in the power supply is minimized thereby making feasible the packing density afforded by the plurality of hinged circuit boards.

2 Claims, 5 Drawing Sheets

ROTARY POSITION TRANSDUCER HAVING HINGED CIRCUIT BOARDS

BACKGROUND OF THE INVENTION

This invention relates in general to a rotary position transducer and, more particularly, to a position transducer which employs a sensor and converter that indicates the absolute rotational position of an input shaft. The input shaft can be coupled to a rotary device such as the shaft of a motor or can be linked to the position of a linear displacement device such as a work table.

Absolute position transducers are known in the art and devices of the type to which this invention is addressed are disclosed in U.S. Pat. No. 4,556,886, No. 4,572,951, No. 4,604,575 and No. 4,612,503. These patents describe the sensing technique employed in both linear and rotational position detecting devices and also disclose a variable reluctance sensor that is employed. These transducers are known and widely used. A discussion of the advantages and disadvantages of various types of rotation angle detectors may be found in Pat. No. 4,604,575.

There are situations in which the transducers are employed where the environment adversely affects the electronic converter thereby reducing the life of the device and degrading its performance. In particular, there are circumstances where vibration, temperature and shock cause convertor malfunctioning and failure. The brute force technique of building these devices to withstand vibration, temperature and shock conditions is to build larger, sturdier and more expensive devices. However, the size of the device is critical for many applications. Unless the device is kept as small as possible, the circumstances in which the device can be employed will be limited.

Accordingly, it is a major purpose of this invention to provide an improved design for a position transducer so as to withstand shock, to operate in high temperature environments and to be as small in size as possible.

It is a related purpose of this invention to provide a device which will have nearly universal application.

And, it is a related purpose of this invention to provide those improved characteristics, including small size, at a reasonable cost.

Accordingly, the goal of this invention is to achieve an optimum trade-off of small size, low cost, ruggedness and ability to operate at high factory termperatures.

BRIEF DESCRIPTION

In brief, one embodiment of the transducer of this invention provides a digital electrical signal output representative of the angular position of an input shaft. The sensor employed in the transducer is a known type of variable inductance device such as a resolver or a device in which a movable core effects inductance. The analog output of the sensor is encoded into digital form by a known type of converter circuitry. The known converter circuitry is mounted on four rigid boards which are adjacent to one another and electrically interconnected to one another by flexible conducting hinges. The boards encircle the sensor to provide a compact package which is mounted in a cylindrical case. Because each board is rigid, the circuitry has enhanced resistance to vibration and shock. Because there are multiple boards with flexible hinges between the boards, the transducer can be relatively small in size.

The power supply contains a 50 KHz oscillator which switches a transistor on and off at a 50 KHz rate. A regulator controls the ON duty cycle of the switching transistor as a function of output DC voltage. Thus, the power supply is on only for the time necessary to maintain the output voltage. The result is a saving in power and of heat generated so that the compact package provided by the hinged circuit board does not overheat.

BRIEF DESCRIPTION OF THE FIGURES

In FIG. 2, the four boards are shown laid out flat adjacent to one another prior to being wrapped around the sensor.

FIG. 6 also indicates how the circuit board arrangement is fabricated.

DESCRIPTION OF THE PREFERRED EMBODIMENT

Figure 1:
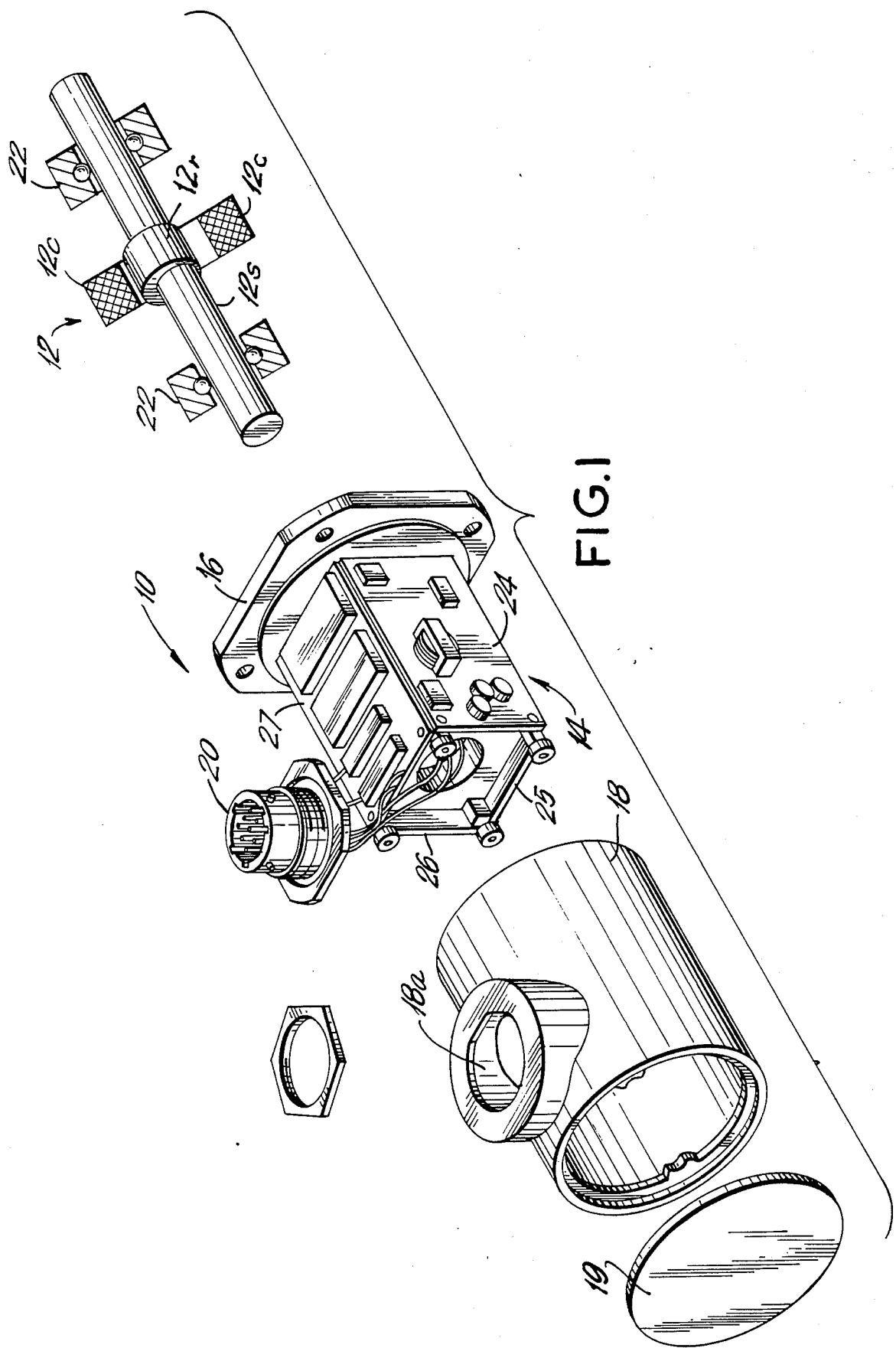
FIG. 1 is an exploded view of an embodiment of this invention showing essentially the sensor unit 12 which fits inside the circuit board arrangement 14, both of which fit inside the case.

All of the FIGs. relate to the same embodiment of the transducer 10. As shown in FIG. 1, there is a sensor unit 12 that converts rotational mechanical input to analog electrical signal. A four board circuit board arrangement 14 is wrapped around the sensor unit 12. The circuit board arrangement provides all the electronics necessary including the power supply, converter and output circuitry. The combined sensor unit 12 and circuit board 14 arrangement is mounted on a plate 16 and fits within a case 18 having an end plate 19. A side opening 18a accomodates the electrical connector 20 through which power is provided to the transducer 10. The output signal can also be provided through the connector 20.

The sensor unit 12 has an eccentric rotor 12r on the center of a shaft 12s. Around this rotor 12r are four sensor coils 12c. Only two of the coils 12c are shown in the FIG. 1 schematic. Two sets of spaced apart bearings 22 on shaft 12s maintain appropriate shaft 12s alignment so that the rotor 12r will provide a repeatable output as the rotor 12r rotates on the axis of the shaft 12s. The shaft 12s is the input shaft which is connected to the device whose position is to be measured.

A preferred type of sensor unit 12 is shown and described in greater detail in Pat. No. 4,604,575, with particular reference to the disclosure relating to FIGS. 1(a) and 1(b) in that patent. As shown therein, each of the coils 12c is composed of a primary coil and secondary coil wound on a core. The four coils 12c and the cores on which they are mounted constitute the stator element of the sensor unit 12. It should be appreciated that though this is the preferred sensor unit 12 design, a resolver type sensor unit can be employed.

Figure 2:
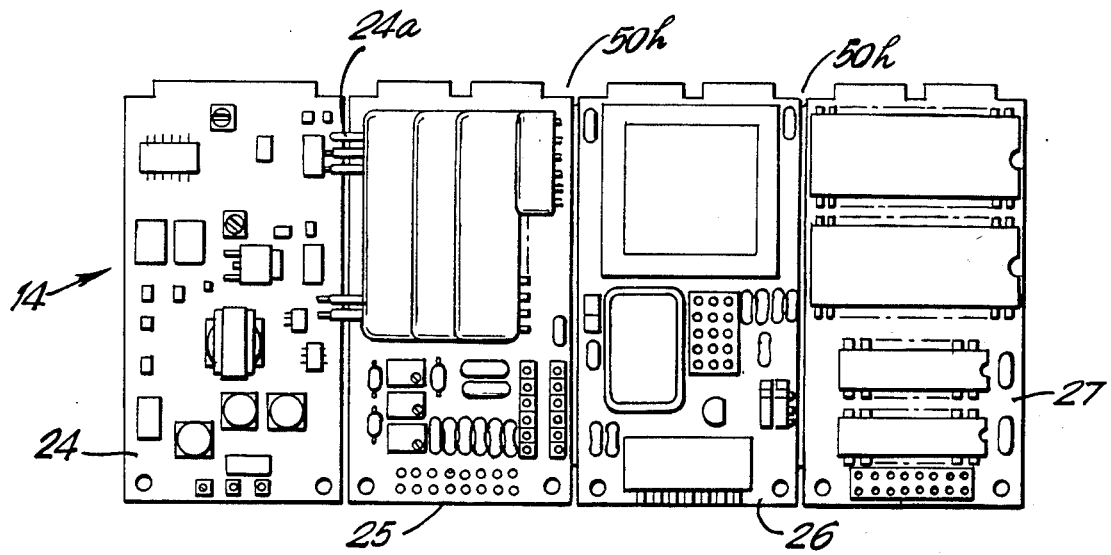
FIG. 2 is a view of the four boards of the FIG. 1 embodiment, on which boards all of the electronics of the transducer are mounted.
Figure 6:
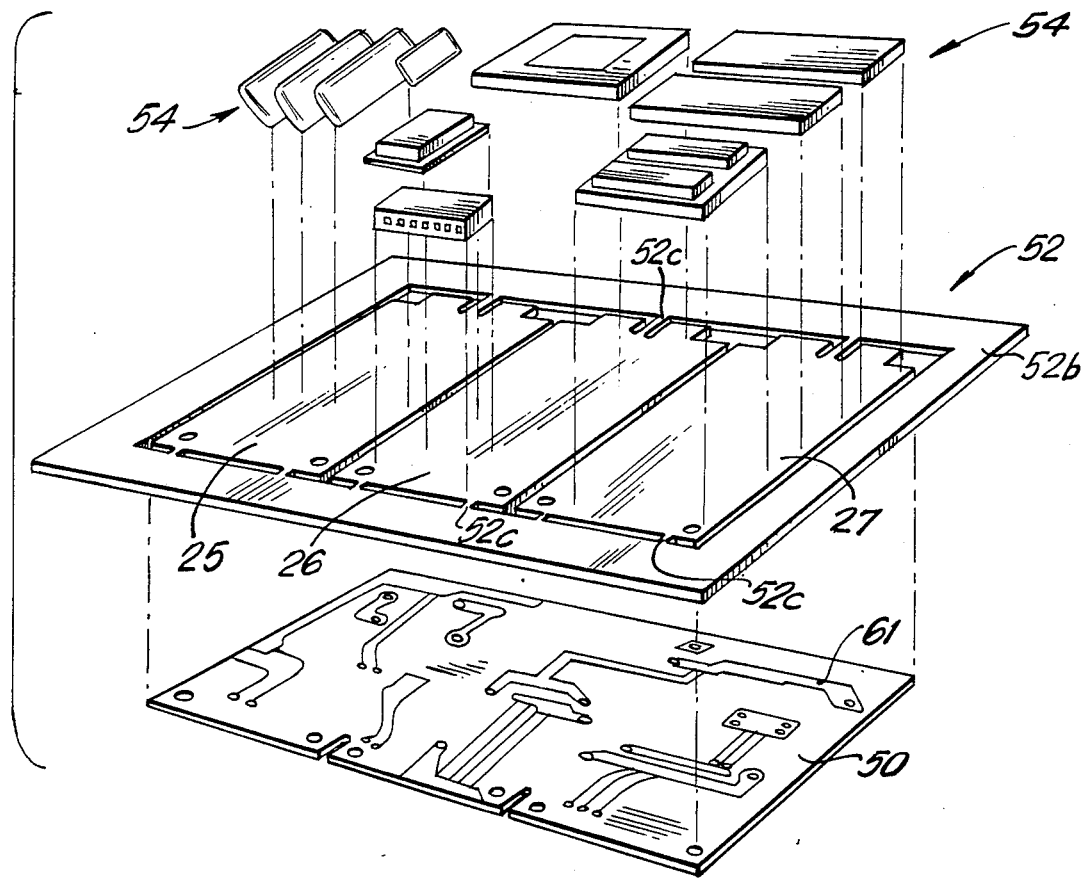
FIG. 6 is an exploded view of a set of three of the four boards shown in FIG. 2 illustrating the flexible sheet 50 having conductive tracks on which the rigid circuit boards 25, 26 and 27 are mounted.
Figure 7:
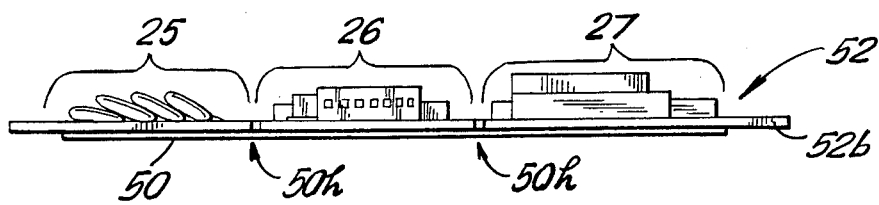
FIG. 7 is a longitudinal end view of the FIG. 6 arrangement assembled, but prior to the border 52b being snapped off.

As shown in FIG. 2, the circuit board arrangement 14 constitutes four separate rigid boards 24, 25, 26 and 27. Three of these four boards are laminated onto a flexible polyimide back sheet 50, as best seen in FIGS. 6 and 7. This underlying sheet has flexible copper conductor tracks 61 plated thereon. These tracks 51 are connected to the appropriate terminals on each of the boards 24 through 27 so as to provide electrical interconnection between components on the boards and between the boards.

The board 24 is essentially the power supply described in greater detail in connection with FIGS. 4 and 5. The board 25 contains essentially the receiving circuit for the signals from the secondary of the sensor coils 12c, as well as the oscillator that is used to energize the primary of the sensor coils 12c. The board 26 contains the converter unit. The converter unit, in a known fashion, compares the signals from the secondary coils of the sensor unit 12 against a reference signal to provide a binary output indicating angular position of the shaft 12s. The board 27 provides the output circuit. The board 27 also includes whatever ROM arrangements are needed to provide the binary output signal in a particular type of scale such as in Gray scale or in BCD format.

Figure 3:
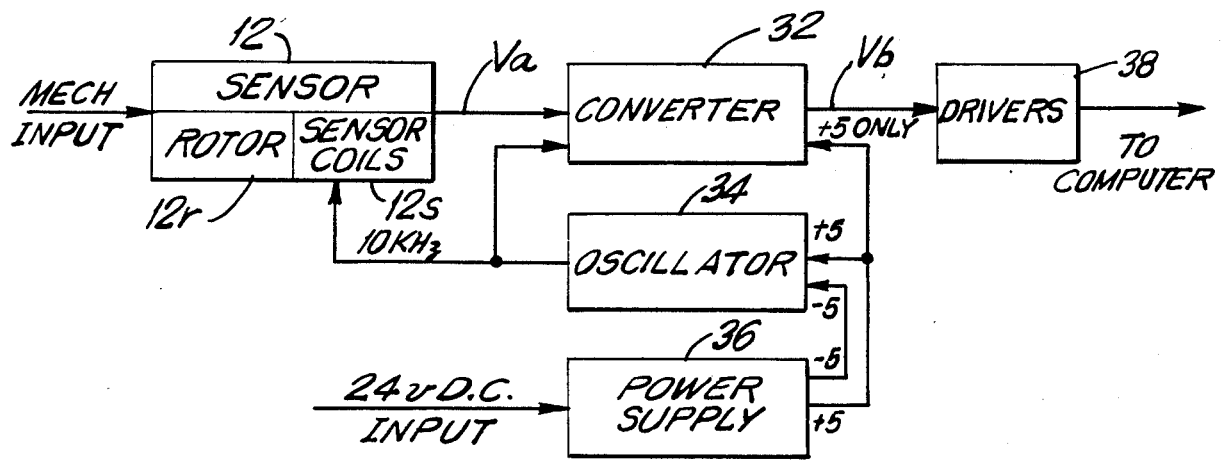
FIG. 3 is a block diagram of the major electric circuit components of the FIG. 1 transducer.

FIG. 3 is a block diagram illustrating the significant components of this circuit board arrangement 14 and the electrical relationship of the circuit boards 14 to the sensor unit 12. As shown in FIG. 3, mechanical input from the device being measured is applied to the sensor 12 so that the rotor 12r rotates within the sensor coils 12c to provide an analog output signal Va to the converter 32. An oscillator 34 operating at ten KHz provides the energizing signal for the primary windings of the sensor coils 12s and also provides a reference signal to the converter 32. The analog signal Va is compared against the reference signal in the convertor 32 for the purpose of generating the shaft angle position signal in binary form. The converter 32 performs that conversion from analog form to binary form in a known manner. This conversion is described in greater detail in the above referenced patent.

The power supply 36 provides the power requirement for the oscillator 34 and for the convertor 32. This power supply is described in greater detail in connection with FIG. 4. It is designed for minimum power requirement to substantially reduce the temperature generated by the operation of the transducer 10.

The binary output Vb of the convertor 32 is a signal that carries in binary form the information carried by the analog signal Va. The drivers 38 are the usual interfacing units required to interface the signal Vb with whatever computer or other recording and processing device is used with this transducer.

Figure 4:
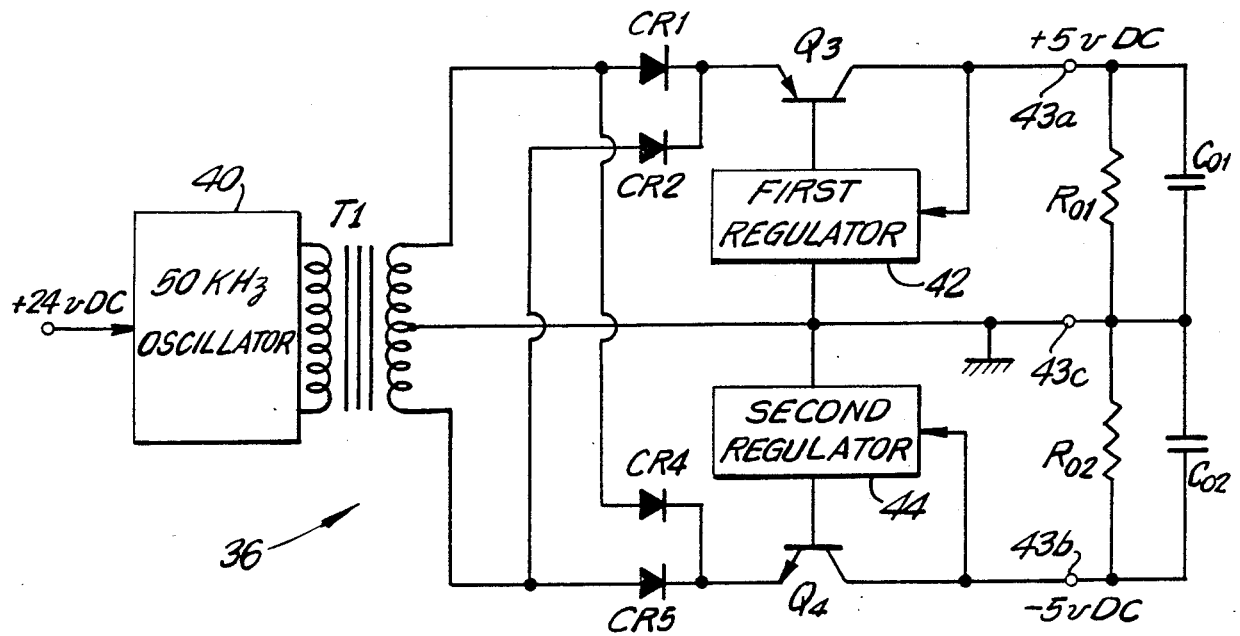
FIG. 4 is a simplified block and circuit diagram of the power supply component 36 of the FIG. 3 circuitry.
Figure 5:
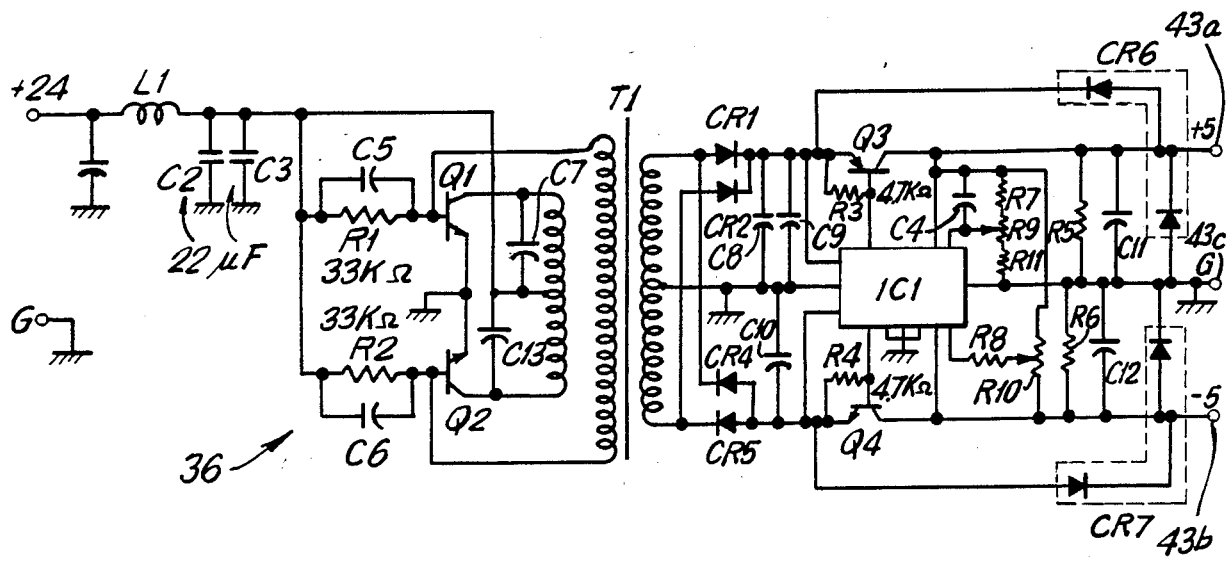
FIG. 5 is a more complete block and circuit diagram of the FIG. 4 power supply.

FIG. 5 is a detailed schematic of the power supply 36 and is provided primarily to illustrate a specific embodiment of an operative power supply. However, the operation of the power supply 36 can best be understood with reference to the FIG. 4 simplified schematic.

A 24 volt DC line input provides energy for a fifty KHz oscillator 40 that provides a 50 KHz signal. The output of this oscillator 40 is coupled to the rest of the power supply circuitry through a voltage step down transformer T1 having a center tap on the secondary to provide a twelve to thirteen volt peak to peak AC signal across the full wave rectifier bridge CR1, CR2, CR4 and CR5.

The positive rectified voltage is applied through a first switching transistor Q3 to provide an output DC voltage at terminal 43a which provides operating power for the oscillator 34 and converter 32. The circuitry fed by this terminal 43a provides the resistance $R_{01}$ and capacitance $C_{01}$ required to make the power supply 36 operate to provide the constant value output DC voltage. The first voltage regulator 42 senses the output DC value and is designed to respond to a five volt threshold level. If the output voltage drops below five volts, the regulator 42 biases the switch Q3 to a point where the ripple at its emitter switches the transistor on and affects a 100 KHz rate. This supplies the additional power required to keep the charge and the capacitance $C_{01}$ to a five volt level. When the output voltage goes above five volts, the regulator 42 biases the switch Q3 to a point where even the peak of the ripple (about six volts) will not turn on the transistor Q3. Thus, the combined operation of the regulator 42 and the switch Q3 maintain the output at 43a at the appropriate voltage level and the capacitance $C_{01}$ into which the power supply 36 feeds maintains the voltage level as a constant DC level.

Thus, when power is required, the state of the first transistor Q3 is switched on and off at a 100 KHz switching rate with an ON duty cycle that is a function of the converter and driver circuit demand. The state of the second transistor Q4 is switched ON and OFF at a 100 KHz rate with a nominal ON duty cycle of something under 20%. First and second regulator circuits 42, 44 are responsive to the power supply output to bias the switching transistors Q3 and Q4 to develop the duty cycle that maintains the output at the terminal 43a at a steady plus 5 volts DC level and the output at the terminal 43b at a steady minus 5 volts DC level. As illustrated in FIG. 4, the circuitry which the power supply feeds has an effective resistance and capacitance so as to provide the RC circuitry necessary to develop and maintain the steady constant five volt DC levels.

The power required through the plus five volt line varies appreciably as a function of the binary code being transmitted. Sixteen "one" bits require sixteen times the power as do fifteen "zero" bits and one "one" bits. In use, the ON duty cycle of the first transistor Q3 will vary from about 20% to 80%. The ON duty cycle of the second transistor Q4 will be fairly constant at some level between 10% and 20%.

Because the power supply circuit is in an OFF state much of the time and because the power loss in the transistor and capacitance circuitry is minimal, the heat developed is kept relatively low and the temperature rise is minimized. This makes possible the small size of the transducer with which this power supply is employed and makes viable the wrapping of the circuit around the sensor 12.

The important point of the switching arrangement provided by the regulators 42, 44 and the transistors Q3 and Q4 is that the power supply circuit is OFF except when necessary to provide power to the downstream circuitry.

FIG. 5 illustrates one specific practical embodiment of the FIG. 4 circuitry and most of the arrangements shown in FIG. 5 would be understood by one in the art.

Suffice it then to point out that the resistors R5, R6 and capacitors C11, C12 are incorporated for the purposes of permitting the testing of the boards before they are installed in the transducer. These elements are not necessary in operation, although C11, C12 do aid in reducing ripple. Two capacitors C8 and C9 are shown in connection with the plus five volt arrangement whereas one capacitor C10 is shown in connection with the minus five volt arrangement. This is only because the greater current on the plus five volt side requires more capacitance and the size of the capacitors that can be employed is limited by the size of the boards so that two capacitors C8 and C9 are employed instead of a single capacitor. The resistors R7, R9 and R11 permit fine-tuning to ensure that the input signal to the integrated chip IC1 is such as to hold the plus five volt output to very tight tolerances. In contrast, the R8, R10 arrangement is not as critical because the minus five volt output does not require as tight regulation.

The regulatory circuitry 42, 44 is incorporated within a single integrated chip IC1 which in a preferred embodiment is an MS5290FP chip. The application of this chip to provide the two regulatory functions is a known application within the skill of the art.

FIGS. 6 and 7 shown an important technique for obtaining the multiple rigid board arrangement in which the boards are hingedly connected to one another so that they can be wrapped around the sensor 12 and fit within the casing 10. This arrangement provides in a typical embodiment a device that has a casing 18 outside diameter of about 6.3 cm. As shown in FIGS. 6 and 7, three rigid circuit boards 25, 26 and 27 are cut out of a single rigid plastic base 52 such that the three boards 24, 25 and 26 are connected by small readily breakable struts 52c to the border 52b. Onto each of these boards 24, 25 and 26 are mounted the various components generally indicated at 54. For ease of illustration, only some of the components 54 are shown.

A polyimide flexible sheet 50 contains the conductive tracks 61 required to inter-connect the various components 54 that are mounted on the three boards 25, 26 and 27. This flexible polyimide sheet 50 is laminated onto the back surface of the board arrangement 52 which includes the border 52b. The narrow struts 52c that hold the three boards to the border 52b are physically broken thereby removing the border 52b and leaving the three boards as separate physical structures laminated onto the flexible polyimide sheet 50. At this point, the sheet 50 can be flexed at the hinge zones 50h to cause the individual boards to assume the square arrangement shown in FIG. 1.

The board 24 on which the power supply 36 is mounted requires relatively few external connections. Thus, in this embodiment, it is put together separately from the other three boards. It is connected by means of the external wiring 24a shown in FIG. 2 to the adjacent board 25.

Figure 8A:
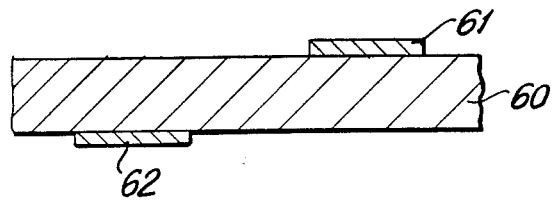
FIGS. 8A, 8B and 8C are cross-sectional views of a small portion of the flexible sheet 50 illustrating the layered arrangement that provides the conductive tracks.
Figure 8B:
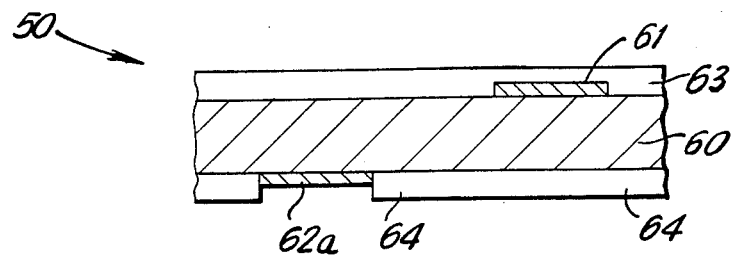
Figure 8C:
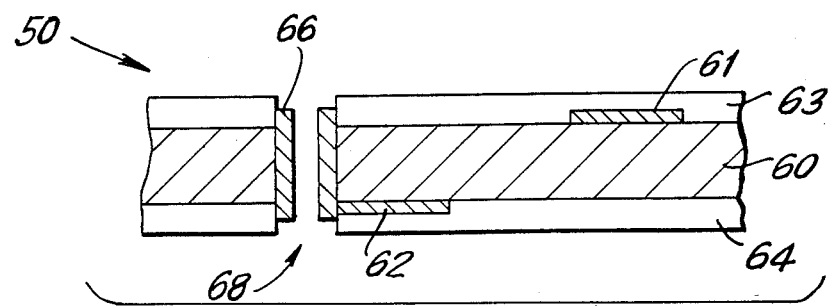

FIGS. 8A, 8B and 8C illustrate the structure of the flexible sheet 50 which is bonded to the rigid boards 25, 26 and 27 and which provides the hinge feature. This sheet 50 is created from a multi-ply arrangement so as to provide a series of ground tracks 61 on one side of the sheet 50 and a series of separate conductive tracks 62 on the bottom side of the sheet 50.

The initial multi-ply sheet is composed of a central polyimide ply 60 and first and second thin copper plies on either side of the central plastic ply 60. These copper plies are etched away except where the conductive tracks 61 and 62 are desired. The tracks 61 on the upper side of the sheet 60 are ground tracks and the tracks 62 on the lower side of the sheet are individual conductive tracks that are employed to interconnect individual terminals of the components 54 on the rigid boards 25, 26 and 27.

FIG. 8A illustrates a small portion of the sheet 50 after the copper has been etched away except where the tracks 61, 62 exist. It might be noted that about 90% of the copper could be etched away during this process of providing the tracks 61, 62. As illustrated in FIG. 8B, further polyimide layers 63 and 64 are laid over the tracks 61 and 62 respectively to provide a protective coating for these tracks 61 and 62. However, where an electrical connection has to be made to one of the tracks 61, 62 the polyimide ply 63 or 64, as the case may be, is etched away over the portion of the track to which connection is to be made. This is illustrated in FIG. 8B at the portion 62a of the track 62 wherein the ply 64 has been etched away. By contrast, the track 61 at the section of FIG. 8B, is covered by the material of the ply 63.

As shown in FIG. 8C, in order to make a connection from the track 62 to a particular component 54, a hole 68 is drilled through the sheet 50. A conductive copper tubular member 66 is bonded in the opening 60 so as to make electrical contact with the track 62. After the insert 66 is placed in position and the polyimide 63, 64 etched away for contact zones such as the zone 62a, the entire sheet 50 can be placed through a solder bath so that a layer of solder (not shown) will coat the zones 62a and insert 66 to facilitate making the appropriate electrical connections.

It might be noted that these individual connecting tracks 62 are placed in the outboard or bottom side of the sheet 50 so as to provide ready access for repair purposes. A crack or a break in a ground track 61 is much less likely to require repair. Thus, it is important that the conductive cylinder 66 be provided to make contact between the individual track 62 and the associated component terminals.

What is claimed is:

1. A position transducer comprising:

a rotary variable inductance sensor having an input shaft adapted to be connected to a device whose position is to be measured;

power supply circuits and an electronic converter coupled to the output of the sensor to provide a digitally encoded signal representative of a rotary position of said input shaft to provide a measurement of the position of the device to which said shaft of said sensor is connected, a plurality of rigid circuit boards, said electronic converter and power supply circuits being mounted on said plurality of rigid boards;

a single track board having flexible portions;

each of said rigid circuit boards being laminated to said track board, said track board having electrical tracks thereon and said rigid circuit boards having circuit components mounted thereon, said tracks connecting components on the various boards to components on other ones of said boards, the individual ones of said plurality of circuit boards being hinged to adjacent circuit boards by said flexible portions of said track board and forming a multi-sided tube, said sensor being positioned within said multi-sided tube.

2. The transducer of claim 1 wherein:

the circuit elements of said boards are mounted directly on the surface of said boards to provide minimal lead lengths and minimize susceptibility to vibration.

* * * * *

Disclaimer and Dedication 4,922,199.—*Ronald D. Fukui*, Portage, Mich.; *Wataru Ichikawa*, Fuchu; *Kazuya Sakamoto*, Akishima, all of Japan. ROTARY POSITION TRANSDUCER HAVING HINGED CIRCUIT BOARDS. Patent dated May 1, 1990. Disclaimer and Dedication filed May 21, 1990, by the assignees, Enprotech Corp. and SG Co., Ltd.

Hereby disclaims and dedicates to the Public the remaining term of said patent.
[*Official Gazette September 25, 1990* ]